(12) United States Patent
Lerche

(10) Patent No.: US 11,887,829 B2
(45) Date of Patent: Jan. 30, 2024

(54) ION DETECTOR CURRENT CONVERTER

(71) Applicant: THERMO FISHER SCIENTIFIC (BREMEN) GMBH, Bremen (DE)

(72) Inventor: Heinz Lerche, Stuhr (DE)

(73) Assignee: Thermo Fisher Scientific (Bremen) GmbH, Bremen (DE)

(*) Notice: Subject to any disclaimer, the term of this patent is extended or adjusted under 35 U.S.C. 154(b) by 94 days.

(21) Appl. No.: 17/519,059

(22) Filed: Nov. 4, 2021

(65) Prior Publication Data

US 2022/0148869 A1    May 12, 2022

(30) Foreign Application Priority Data

Nov. 6, 2020 (GB) .................................. 2017542

(51) Int. Cl.
*H01J 49/02* (2006.01)
*H01J 49/42* (2006.01)

(52) U.S. Cl.
CPC .......... *H01J 49/022* (2013.01); *H01J 49/025* (2013.01); *H01J 49/4215* (2013.01)

(58) Field of Classification Search
CPC ..... H01J 49/022; H01J 49/025; H01J 49/4215
See application file for complete search history.

(56) References Cited

U.S. PATENT DOCUMENTS

| | | |
|---|---|---|
| 4,114,050 A | 9/1978 | Lerche |
| 6,011,397 A | 1/2000 | Yasuda |
| 9,431,976 B2 | 8/2016 | Lerche |
| 2006/0080045 A1 | 4/2006 | Steiner |

FOREIGN PATENT DOCUMENTS

| | | |
|---|---|---|
| CN | 211825826 U | 10/2020 |
| WO | WO-2010023706 A1 | 3/2010 |
| WO | WO-2015104572 A1 | 7/2015 |

OTHER PUBLICATIONS

Combined Search and Examination Report mailed on Aug. 13, 2021, for GB Application No. 2017542.8, 12 pages.
EP21206109.7, Extended European Search Report, dated Apr. 11, 2022, 6 pages.

*Primary Examiner* — Nicole M Ippolito
*Assistant Examiner* — Hanway Chang

(57) ABSTRACT

A conversion circuit is arranged for converting an ion detection current ($i_d$) produced by an ion detector into an ion detection signal (P). The conversion circuit comprises an input stage for converting the ion detection current ($i_d$) into an ion detection voltage ($V_d$), an output stage for converting the ion detection voltage into the detection signal (P), the output stage being arranged for drawing a first current dependent on the ion detection voltage, and a supplementary stage for providing a second current ($i_s$) dependent on the ion detection voltage to the output stage. The second current may be substantially equal to the first current.

15 Claims, 6 Drawing Sheets

ION DETECTOR CURRENT CONVERTER

CROSS-REFERENCE TO RELATED APPLICATIONS

The present application claims priority benefit under one or more of 35 U.S.C. 119(a)-119(d) of GB Patent Application No. 2017542.8, filed Nov. 6, 2020, which is hereby incorporated by reference herein in its entirety for all purposes.

FIELD OF THE INVENTION

The present invention relates to an ion detector current converter. More in particular, the present invention relates to a conversion circuit for converting an ion detector current produced by an ion detector into an ion detection signal, such as a frequency signal.

BACKGROUND OF THE INVENTION

Ion detectors are well known and are, for example, used in various spectrometers, such as mass spectrometers. Typical ion detectors used in mass spectrometers are Faraday cups, compact discrete dynodes (CDDs) and secondary electron multipliers (SEMs). In some mass spectrometers, a plurality of Faraday cups is combined with one or two other types of ion detectors, the Faraday cups being used for ions occurring in larger quantities and the other type(s) of ion detector being used for ions occurring in smaller quantities.

The ions impinging on a Faraday cup can cause a small detection current to flow through a resistor which typically has a high resistance. This resistor may be referred to as conversion resistor, as it converts the detection current into a detection voltage. The resulting voltage across the conversion resistor, which voltage may be referred to as ion detection voltage and which represents the number of ions, may be converted into a frequency using a voltage-to-frequency converter (VFC). This frequency represents the voltage and hence represents the number of ions. Accordingly, each Faraday cup may produce, through its associated VFC, an output signal consisting of pulses, the number of pulses per second representing the quantity of ions impinging on the particular Faraday cup.

In practice it has been found difficult to accurately measure the very small detection currents produced by Faraday cups and other ion detectors. When passing such small currents through a conversion resistor to produce detection voltages, extremely high resistor values are necessary to produce suitable detection voltages. For example, a detection current of 1 fA (femtoampere) passing through a resistor having a resistance of 10 T$\Omega$ (teraohm) produces a detection voltage of only 10 mV (millivolt). To accurately determine this small voltage, an integrating measurement technique is used which integrates the voltage over a period of time, which may have a duration of several minutes. U.S. Pat. No. 4,114,050 (Lerche), which is hereby incorporated by reference, discloses an integrating circuit which is suitable for integrating small voltages. The integrating circuit can serve as a voltage-to-frequency converter (VFC), as it is arranged for producing a pulsed output signal.

Although integrating the small detection voltage over an extended period of time effectively reduces noise, it suffers from the disadvantage that conditions, such as the temperature, may change in that period of time. It has been found that resistors having large resistor values, such as a few hundred M$\Omega$ (megaohm) or several T$\Omega$ (teraohm), have a relatively large temperature coefficient. That is, a change in temperature may cause a noticeable difference in their resistance, which is of course highly undesirable when determining a detection current during several minutes.

It has already been proposed to compensate the undesired characteristics of resistors having a very high resistance by additional circuit elements. U.S. Pat. No. 9,431,976 (Lerche), which is hereby incorporated by reference, discloses a transimpedance amplifier for use in isotope ratio mass spectrometry. The transimpedance amplifier may act as the input stage of an ion detection current converter. According to U.S. Pat. No. 9,431,976, the resistor having a very high resistance is surrounded by a number of capacitive elements, to which compensation voltages are supplied. Although this arrangement works well, it has been found that under certain circumstances the VFC or other subsequent stage draws a current through the conversion resistor. Even if this current is less than 1 mA, it may still cause the temperature of the conversion resistor to rise during the measurement period, thus detrimentally influencing the measurement.

SUMMARY OF THE INVENTION

It is an object of the present invention to overcome the drawbacks of the prior art and to provide a conversion circuit which is capable of converting an ion detection current into an ion detection signal, which is arranged to avoid influencing the temperature of the conversion resistor.

Accordingly, the present invention provides a conversion circuit for converting an ion detection current produced by an ion detector into an ion detection signal, the conversion circuit comprising:
  an input stage for converting the ion detection current into an ion detection voltage, and
  an output stage for converting the ion detection voltage into the detection signal, the output stage being arranged for drawing a first current dependent on the ion detection voltage, wherein the conversion circuit further comprises:
  a supplementary stage for providing a second current dependent on the ion detection voltage to the output stage,
wherein the second current is substantially equal to the first current.

By providing a supplementary stage which provides a second current to the output stage, the current that has to be produced by the input stage, and that could flow through the conversion resistor, is reduced. By providing a second current which is dependent on the ion detection voltage, it is possible to balance the currents in such a way that the current drawn by the output stage no longer influences the current flowing through the conversion resistor. By arranging the supplementary stage so as to provide a second current that is substantially equal to the first current, it is achieved that the current drawn by the output stage is provided entirely, or at least almost entirely, by the supplementary stage. In other words, the supplementary stage is arranged for providing the current drawn by the output stage, or at least most of the current drawn by the output stage. In this way, it is avoided that current drawn by the output stage is provided via the conversion resistor, which would lead to heating the conversion resistor, which in turn would cause the resistor value and the resulting detection voltage across the resistor to change. This problem is solved by the circuit of the invention.

As mentioned above, the second current is substantially equal to the first current. Ideally, the second current would be 100% of the first current, but this is difficult to realize in practice. Accordingly, the second current may be at least 90% of the first current, preferably at least 95% of the first current, more preferably at least 99% of the first current. Conversely, the second current may be at most 110% of the first current, preferably at most 105% of the first current, more preferably at most 101% of the first current. It can thus be seen that a suitable range of the second current would for example be between 90% and 110% of the first current, although other ranges, such as between 95% and 101%, or between 80% and 100%, are also possible.

The input stage may comprise an input amplifier, the input resistor being arranged in a feedback loop of the input amplifier. The input resistor may have a resistance of at least 100 MΩ, preferably at least 1 GΩ, preferably at least 10 GΩ, still more preferably at least 1 TΩ.

The supplementary stage may thus comprise an electronic circuit arranged for providing a current to the output stage, the current being dependent on the detection voltage, as the current drawn by the output stage is dependent on the detection voltage. In an embodiment, the supplementary stage comprises at least one current mirror for providing the second current. A current mirror allows a current to be accurately controlled. The current mirror may comprise two or more transistors, the bases of at least two transistors being connected directly and the collector of one of those two transistors being connected to the bases (while this description applies to bipolar transistors, those skilled in the art will understand that other types of transistors, such as field effect transistors, may be used instead).

In an embodiment, the at least one current mirror comprises a complementary Darlington circuit. As is well known, a complementary Darlington circuit can comprise two transistors, for example bipolar transistors, where the collector of the first transistor is connected with the base of the second transistor, and the emitter of the first transistor is connected with the collector of the second transistor. Such a configuration provides a higher current amplification and is thus effective when an current is to be provided, such as the second current provided by the supplementary stage.

The at least one current mirror may be coupled with an input transistor for providing an input current to the current mirror, the input current being dependent on the ion detection voltage. Thus, the detection voltage may be fed to the base of the input transistor, while the collector of the input resistor may be connected to the bases of the current mirror.

In an embodiment, the input stage can comprise an input amplifier, while the input resistor can be arranged in a feedback loop of the input amplifier. Thus, the input resistor or conversion resistor can be connected between a negative input terminal and an output terminal of the input amplifier, thus constituting a feedback loop.

The output stage may comprise an integrator for integrating the detection voltage over a period of time. Although various types of integrator may be used, a particularly suitable one is disclosed in above-mentioned U.S. Pat. No. 4,114,050. An integrator of this kind effectively acts as a voltage-to-frequency converter. Accordingly, the circuit may further comprise a voltage-to-frequency converter (VFC) coupled to the output stage.

The invention additionally provides a mass spectrometer comprising a conversion circuit according to any of the preceding claims. The mass spectrometer may further comprise at least one detector, such as a Faraday cup, a compact discrete dynode (CDD) and/or a secondary electron multiplier (SEM). The mass spectrometer may further comprise at least one of an ion source, a beam focus unit and a mass filter unit. The mass filter unit may comprise a multipole unit, such as a quadrupole unit.

DETAILED DESCRIPTION OF THE DRAWINGS

The present invention provides a conversion circuit for converting an ion detection current produced by an ion detector into an ion detection signal, which circuit is particularly, but not exclusively, suitable for use in spectrometers, such as mass spectrometers.

Figure 1:
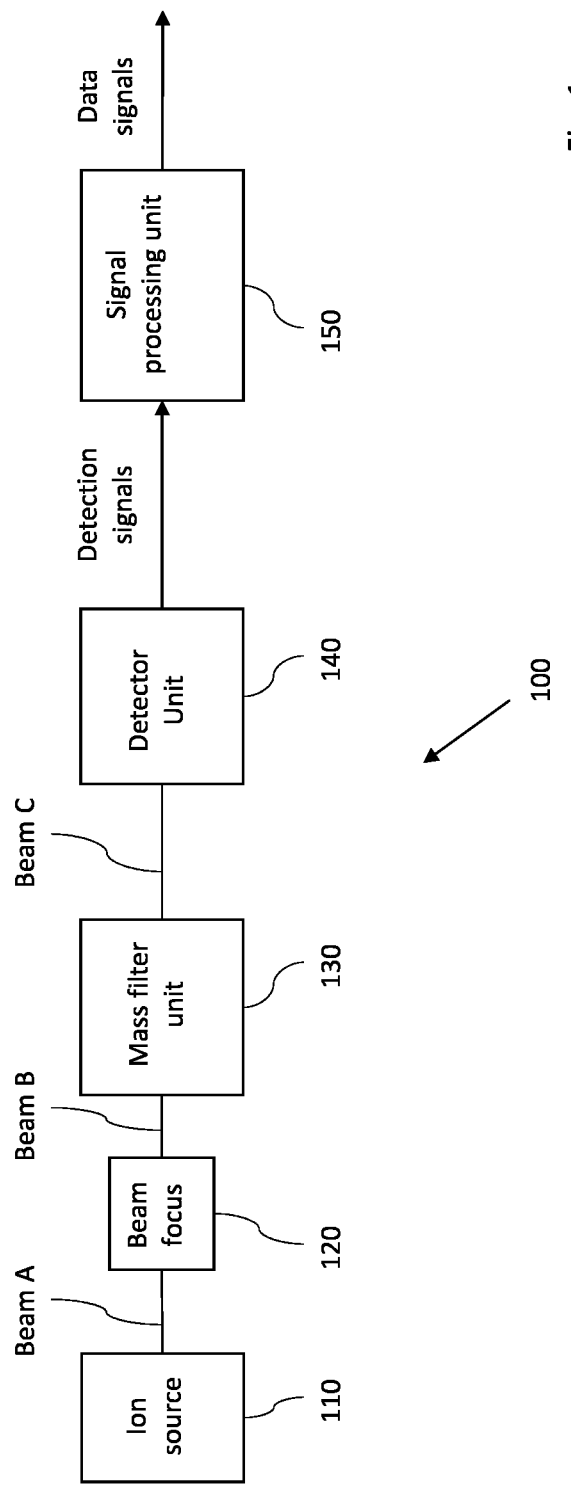
FIG. 1 schematically shows a mass spectrometer in which the invention may be applied.

A mass spectrometer in which the invention may be applied is, by way of example, schematically illustrated in FIG. 1. The mass spectrometer 100 is shown to comprise an ion source 110, a beam focusing unit 120, a mass filter unit 130, a detector unit 140, and a detector signal processing unit 150. The ion source 110 may be a plasma source, such as an inductively coupled plasma (ICP) source, or a non-ICP source, such as a filament source. The ion source 110 is arranged for producing an original ion beam 101 which is focused by the beam focusing unit 120 to become a focused ion beam 102. The beam focusing unit 120 can comprise suitable ion optics which may be known per se. the mass filter unit 130 may comprise a magnetic sector unit or a multipole unit, such as a quadrupole unit. When the mass filter unit 130 is constituted by a magnetic sector unit, a further mass filter unit (not shown) may optionally be arranged between the beam focusing unit 120 and the magnetic sector unit, see also the above-mentioned United States patent application US 2018/0308674.

In the mass filter unit 130, ions contained in the ion beam 102 may be separated according to their respective masses. When the mass filter unit 130 comprises a sector field unit, such as a magnetic sector unit, the single focused ion beam 102 entering the magnetic sector unit is split up into multiple ions beams 103 which may reach different detectors of the detector unit 140, allowing ions having different masses to be detected separately. The detector unit 140 produces ion detection signals, such as detection currents, which can be amplified and further processed in the signal processing unit 150, resulting in data signals which may include an average detection frequency per ion detector, and hence per ion mass range.

Figure 2:
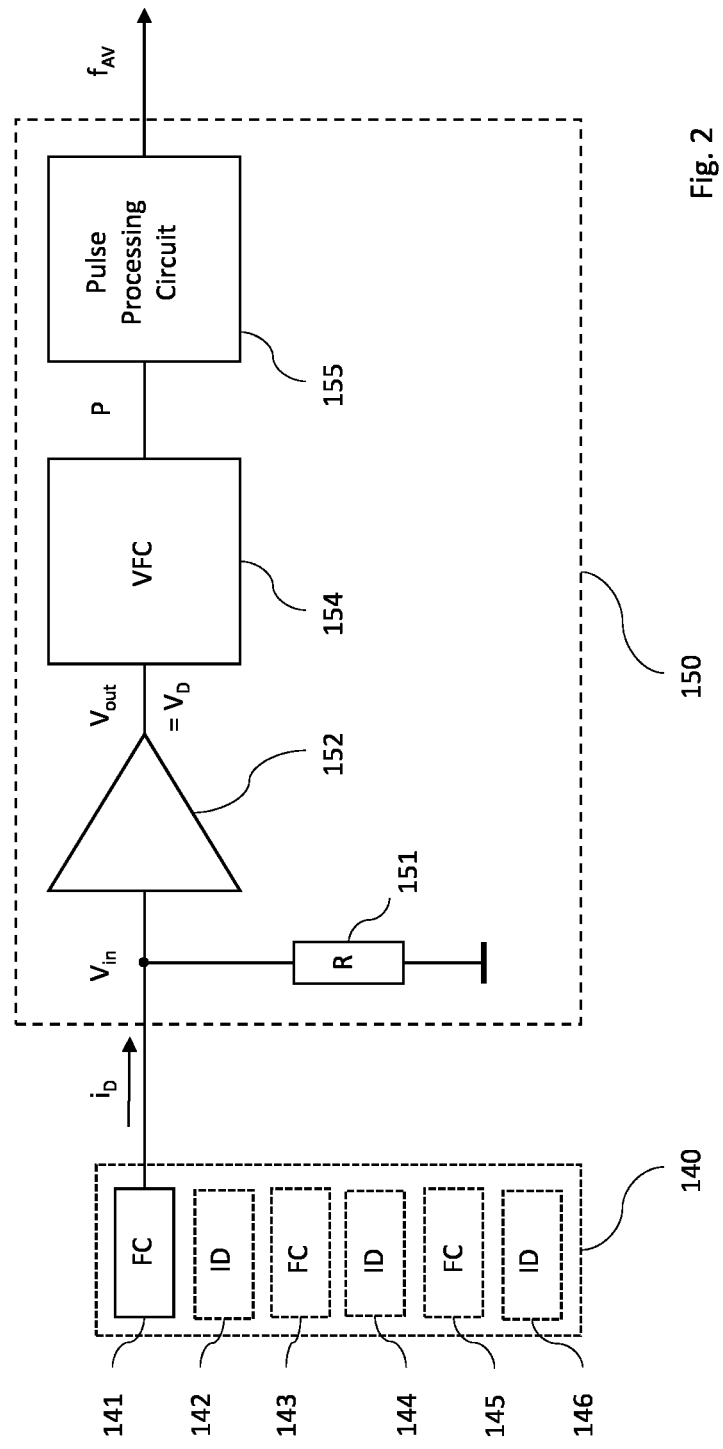
FIG. 2 schematically shows part of the mass spectrometer of FIG. 1 in more detail.

Part of the mass spectrometer 100 of FIG. 1 is shown in more detail in FIG. 2. In particular, FIG. 2 schematically shows part of the detector unit 140 and part of the signal processing unit 150.

The detector unit 140 is shown to comprise Faraday cups (FC) 141, 143 and 145, and additional ion detectors (ID)

142, 144 and 146. The detector unit 140 may comprise more (or less) Faraday cups and/or more (or less) additional ion detectors than shown here. In the example shown, the additional ion detectors are each arranged next to a Faraday cup, but this is not essential. The additional ion detectors may comprise compact discrete dynodes (CDDs) and/or secondary electron multipliers (SEMs).

As is well known, Faraday cups and similar ion detectors produce small currents proportional to the number of impinging ions. These small currents, typically in a range from 1 fA to 1 nA, are converted into a voltage which is then amplified to produce an ion detection voltage. To this end, the signal processing unit 150 comprises an input resistor 151 which has a very large value, typically in a range from 10 GΩ to 10 TΩ. Such large resistor values are necessary to produce a suitable voltage for further processing: a current of 1 pA ($10^{-12}$ A) flowing through a resistor of 1 TΩ ($10^{+12}$Ω) produces a voltage across the resistor of just 1 V.

The detector current $i_D$ produced by the Faraday cup 141 is, in the schematic diagram of FIG. 2, fed through the input or conversion resistor 151 to ground and produces across the resistor 151 an input voltage $V_{in}$ for the amplifier 152. It is noted that the amplifier 152 is drawn here only schematically, and that the amplifier 152 may comprise an operational amplifier having the input resistor 151 in its negative feedback loop, thus connecting the resistor 151 to ground via the operational amplifier (virtual ground). It is further noted that only a single input resistor 151 and a single amplifier 152 are shown here for the sake of simplicity of the drawing, but it will be understood that each Faraday cup and/or similar detector 141, 143 and 145 of the detector unit 140 may be connected to an individual input resistor 151 and an individual amplifier 152. In some embodiments, two or more Faraday cups may share an input resistor and an amplifier. The ion detectors 142, 144 and 146 may each be connected to a discriminator, which may in turn be connected to a counter (not shown in FIG. 2).

The amplifier 152 produces an output voltage $V_{out}$ which may be equal to, or larger than the input voltage $V_{in}$ for example 10 or 100 times larger. If the output voltage $V_{out}$ has substantially the same magnitude as the input voltage $V_{in}$, the amplifier 152 may be used as a buffer only. The output voltage $V_{out}$, which may also be referred to as detection voltage $V_D$ as it represents the quantity of detected ions, is fed to a voltage-to-frequency converter (VFC) 154, which produces pulses P with a frequency proportional to the voltage $V_{out}$. It has been found that VFCs have a high degree of linearity which makes accurate detections possible. It is noted that detector signals originating from some types of detectors, such as compact discrete dynodes (CDDs) and/or secondary electron multipliers (SEMs), are typically not fed to a VFC. It is further noted that the present invention is not limited to ion detection signals produced by ion detectors but may also be used in other fields, such as optical signals.

The pulses P produced by the VFC 154 may be fed to an optional pulse processing circuit 155 which may determine the average frequency of the pulses produced by the VFC 154 during certain time periods, which may be referred to as measurement intervals. For each time period, the pulse processing circuit 155 may produces an average frequency $f_A$. This average frequency can represent the number of ions that impinged upon the corresponding detector during that particular time period. To determine the average frequency, the pulse processing circuit may count the number of pulses during a time period, determine the duration of that time period, and divide the number of pulses by the duration. In some embodiments, the optional pulse processing circuit 155 may additionally or alternatively produce other data, such as the variance of the pulses and/or the duration of the pulse intervals. In some embodiments, the signal processing unit 150 may not output an average frequency or similar data but the actual pulses P produced by the VFC 154.

Figure 3:
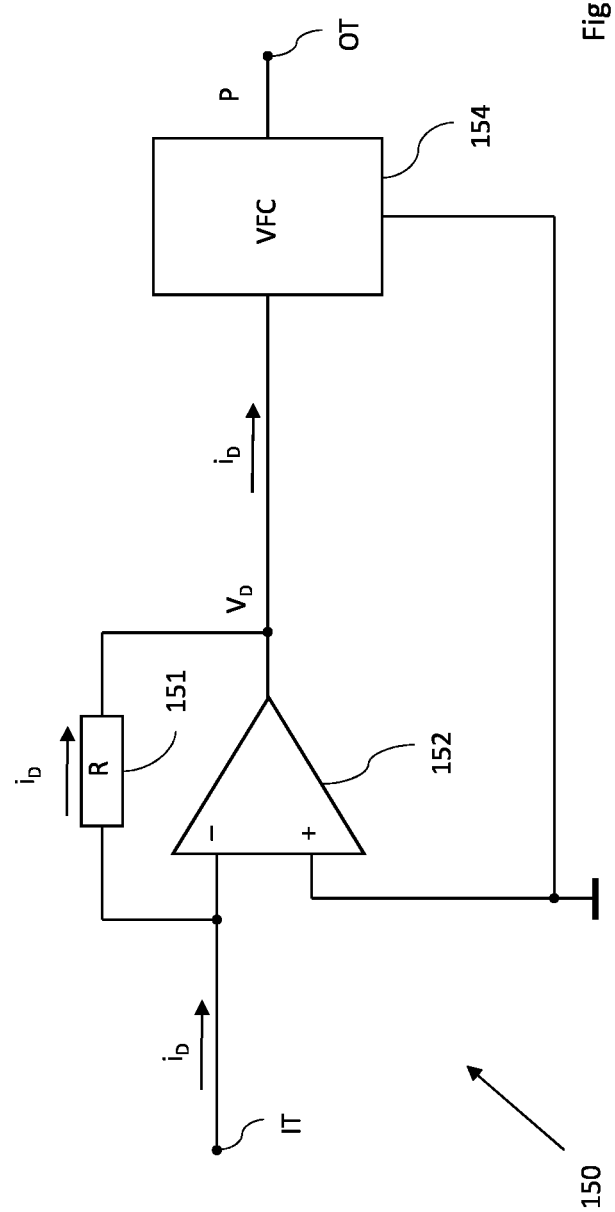
FIG. 3 schematically shows a conversion circuit according to the prior art.

An exemplary embodiment of a signal processing unit 150 according to the prior art is schematically illustrated in FIG. 3. In the embodiment shown, the detection signals received by the signal processing unit 150 comprise at least one detection current $i_D$ while the data signals produced by the signal processing unit 150 comprise at least one signal relating to a frequency, such as a series of pulses P having a frequency which is dependent on the detection current.

The exemplary signal processing unit 150 of FIG. 3 is constituted by a conversion circuit which comprises an input stage and an output stage. The input stage, which comprises an input resistor 151 and an amplifier 152, is arranged for converting the ion detection current $i_D$ received at the input terminal IT into an ion detection voltage $V_D$. The output stage, which comprises in the embodiment shown a voltage-to-frequency converter (VFC) 154, is arranged for converting the ion detection voltage $V_D$ into a series of pulses P which are supplied to the output terminal OT of the signal processing unit 150.

The amplifier 152 is in the embodiment shown constituted by an operational amplifier of which the non-inverting input terminal is connected to ground and of which the inverting input terminal is connected to both the input terminal IT of the signal processing unit and, via the input resistor 151, to the output of the operational amplifier. As the inverting input terminal constitutes a virtual ground, the detection current $i_D$ flowing through the input resistor 151 causes a detection voltage $V_D$ at the output of the operational amplifier 152. It can thus be seen that the input resistor 151 acts as conversion resistor, converting the detection current $i_D$ into the detection voltage $V_D$. As mentioned above, the input or conversion resistor 151 typically has a very high resistance, for example 100 GΩ, 1 TΩ or 10 TΩ.

Those skilled in the art will realize that the VFC 154 will draw an input current, depending on the detection voltage $V_D$ and the input impedance of the VFC. In a typical example, the input impedance of the VFC 154 may be approximately 250 kΩ while the maximum value of the detection voltage $V_D$ is approximately 100 V, leading to an input current into the VFC 154 of approximately 0.4 mA, which has to be produced by the operational amplifier 152. Even though this current is small, it may still lead to some heating of the components, and thus to changes in the resistance of the input resistor 151, which is clearly undesired.

Figure 4:
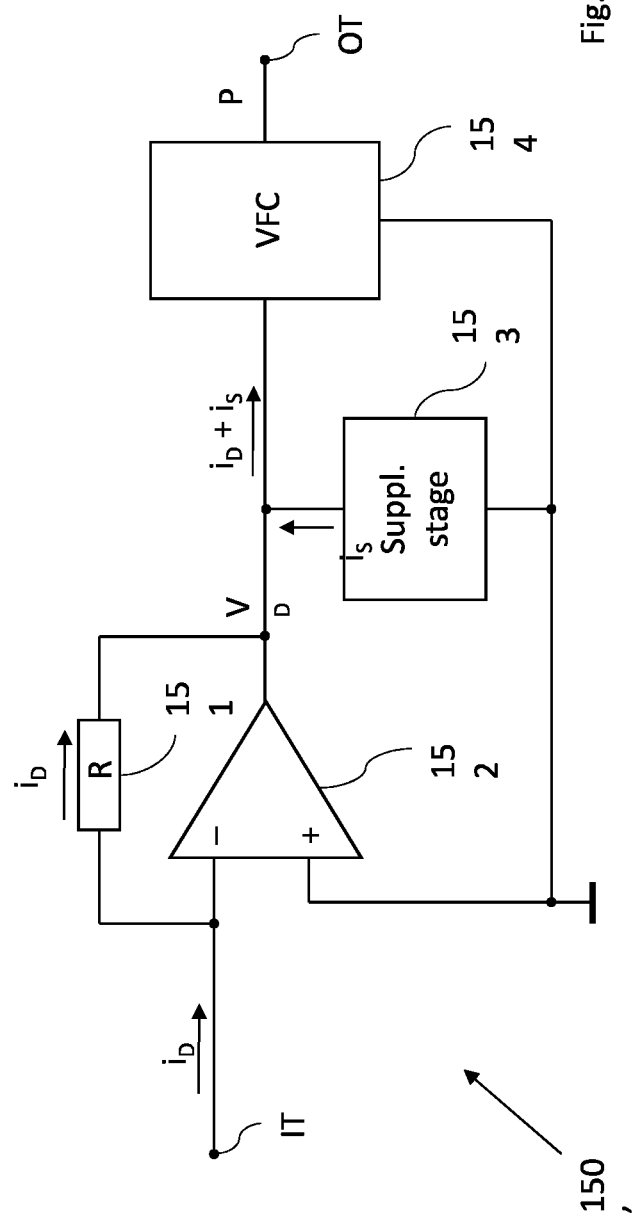
FIG. 4 schematically shows a conversion circuit according to the invention.

The exemplary signal processing unit 150' of FIG. 4 comprises a conversion circuit which includes an input stage and an output stage. As in the embodiment of FIG. 3, the input stage, which comprises an input resistor 151 and an amplifier 152, is arranged for converting the ion detection current $i_D$ received at the input terminal IT into an ion detection voltage $V_D$. The output stage, which comprises a voltage-to-frequency converter (VFC) 154 as in FIG. 3, is arranged for converting the ion detection voltage $V_D$ into a series of pulses P which are supplied to the output terminal OT of the signal processing unit 150'.

It will be understood that the output stage of the conversion circuit may comprise other components, such as an analog/digital converter (ADC), instead of or in addition to the VFC 154. The conversion circuit may further comprise additional circuitry as disclosed in U.S. Pat. No. 9,431,976, for example.

In contrast to FIG. 3, the embodiment of FIG. 4 comprises a supplementary stage 153 which is arranged to provide a supplementary current $i_S$ to the output stage, which supplementary current is dependent on the ion detection voltage $V_D$. That is, in response to the detection voltage $V_D$ the supplementary stage produces a supplementary current $i_S$. This supplementary current $i_S$ can be proportional to the detection voltage $V_D$, such that the supplementary current is zero when the detection voltage is zero. Accordingly, the supplementary stage 153 is arranged to provide substantially the entire input current to the output stage, which input current is in the embodiment shown determined by the detection voltage $V_D$ and the input resistance of the output stage.

As shown in FIG. 4, the input current to the output stage, in the case shown the VFC 154, can be considered to be the sum of the supplementary current $i_S$ and the detection current $i_D$. However, as mentioned above, the detection current $i_D$ may for example be 1 nA or less, while the supplementary current may for example be approximately 0.4 mA=400,000 nA. Accordingly, the contribution of the detection current $i_D$ can normally be neglected.

Figure 5:
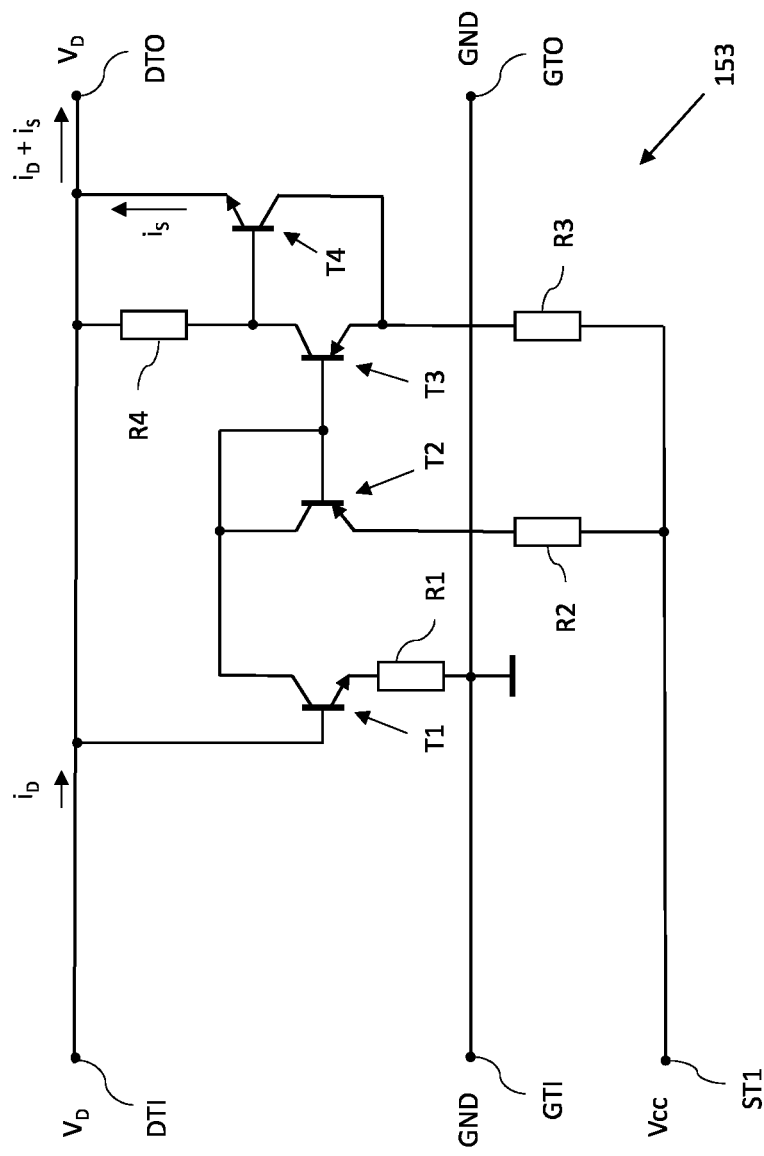
FIG. 5 schematically shows an exemplary embodiment of a supplementary stage of the conversion circuit according to the invention.

An exemplary embodiment of the supplementary stage 153 is schematically illustrated in FIG. 5. The supplementary stage 153 is shown to comprise a detection input terminal DTI, a detection output terminal DTO, a ground input terminal GTI, a ground output terminal GTO, and a supply terminal ST1. This supply terminal ST1 may carry a supply voltage Vcc of approximately +100 V. In the embodiment shown, the supplementary stage comprises four transistors T1-T4 and four resistors R1-R4. In the embodiment shown, bipolar transistors are used, but those skilled in the art will readily be able to adapt the circuitry to field effect transistors (FETs) or other transistors.

The transistors T2 and T3 form a current mirror, together with the resistors R2, R3 and R4. To this end, the bases of the transistors T2 and T3 are connected, while the collector of transistor T2 is connected to these bases. Suitable voltage and current values are achieved with the aid of the resistor R2, which is coupled between the emitter of transistor T2 and the supply terminal ST1, the resistor R3, which is coupled between the emitter of transistor T3 and the supply terminal ST1, and the resistor R4, which is coupled between the collector of transistor T3 and the detector terminals DTI and DTO.

As can be seen, the transistors T3 and T4 form a complementary Darlington circuit, as the collector of transistor T3 is coupled to the base of transistor T4, while the collector of transistor T4 is coupled to the emitter of transistor T3. This transistor pair acts as a single transistor having a higher current amplification, which is desirable for the present purpose.

Transistor T1 serves for providing an input current to the current mirror, the input current being dependent on the ion detection voltage $V_D$. To this end, the base of transistor T1 is coupled with the detection input terminal DTI, while its collector is connected with the bases of the transistors T2 and T3 which constitute the current mirror. Resistor R1 is coupled between the emitter of transistor T1 and ground and serves to set the emitter voltage of transistor T1.

In operation, the base of transistor T1 receives the detection voltage $V_D$, causing the transistor T1 to conduct and to produce a current proportional to the detection voltage $V_D$. It is noted that the supply voltage Vcc may be selected to be a few volts higher than the maximum detection voltage $V_D$. When the maximum detection voltage $V_D$ is 100 V, for example, the supply voltage Vcc may be selected to be equal to 106 V, thus always leaving a difference of +6 V for the transistors to operate.

As mentioned above, the detection current $i_D$ can normally be neglected relative to the supplementary current $i_S$.

Figure 6:
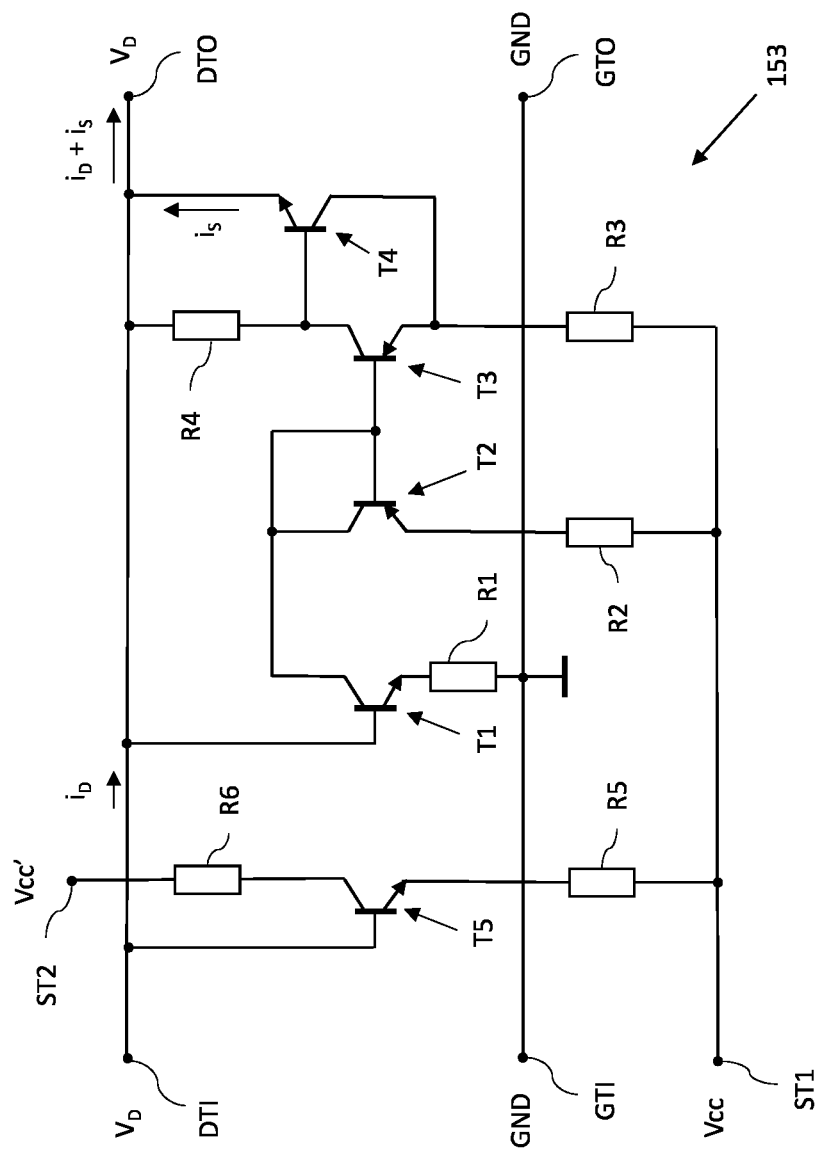
FIG. 6 schematically shows another exemplary embodiment of a supplementary stage of the conversion circuit according to the invention.

Another embodiment of the supplementary stage 153 is schematically illustrated in FIG. 6. The supplementary stage 153 of FIG. 6 is identical to the one of FIG. 5, except for the addition of a fifth transistor T5 and fifth and sixth resistors R5 and R6. The base of the fifth transistor T5 is coupled with the detection input terminal DTI, while the emitter of the fifth transistor T5 is coupled, via the transistor R5, with the supply terminal ST1. The collector of the fifth transistor T5 is coupled, via the sixth resistor R6, to a further supply terminal ST2 which receives an auxiliary supply voltage Vcc' of, for example, −6 V. The fifth transistor T5 and its associated resistors R5 and R6 constitute an additional load for the combined supply voltage Vcom=Vcc+Vcc'. This additional load depends on the output voltage of the amplifier (152 in FIG. 4), that is, on the detection voltage $V_D$. The additional load serves to keep the power supplied by the supply voltage sources approximately constant.

It can be seen that a supplementary stage according to the invention can be achieved with a relatively small number of components. The supplementary stage provides a conversion circuit which allows a stable temperature of conversion resistors having a very high resistance. In a conversion circuit of the invention, the conversion resistor may have a resistance of at least 100 MΩ, (megaohm, $10^6$ Ohm), preferably at least 1 GΩ (gigaohm, $10^9$ Ohm) or more preferably at least 10 GΩ, but values of 1 TΩ (teraohm, $10^{12}$ Ohm) or higher, such as 10 TΩ, 20 TΩ, 50 TΩ or even 100 TΩ can also be envisaged.

It will be understood by those skilled in the art that the invention is not limited to the embodiments shown and that many additions and modifications may be made without departing from the scope of the invention as defined in the appending claims.

What is claimed is:

1. A conversion circuit for converting an ion detection current produced by an ion detector into an ion detection signal, the conversion circuit comprising:
    an input stage for converting the ion detection current into an ion detection voltage, and
    an output stage for converting the ion detection voltage into the detection signal, the output stage being arranged for drawing a first current dependent on the ion detection voltage,
    wherein the conversion circuit further comprises:
    a supplementary stage for providing a second current dependent on the ion detection voltage to the output stage,
    wherein the second current is substantially equal to the first current.

2. The conversion circuit according to claim 1, wherein the second current is at least 90% of the first current, preferably at least 95% of the first current, more preferably at least 99% of the first current.

3. The circuit according to claim 1, wherein the second current is at most 110% of the first current, preferably at most 105% of the first current, more preferably at most 101% of the first current.

4. The circuit according to claim 1, wherein the supplementary stage comprises at least one current mirror for providing the second current.

5. The circuit according to claim 4, wherein the at least one current mirror comprises a complementary Darlington circuit.

6. The circuit according to claim 4, wherein the at least one current mirror is coupled with an input transistor for providing an input current to the current mirror, the input current being dependent on the ion detection voltage.

7. The circuit according to claim 1, wherein the input stage comprises an input amplifier, the input resistor being arranged in a feedback loop of the input amplifier.

8. The circuit according to claim 7, wherein the input resistor has a resistance of at least 100 MΩ, preferably at least 1 GΩ, preferably at least 10 GΩ, still more preferably at least 1 TΩ.

9. The circuit according to claim 8, wherein the input resistor has a resistance at least 10 TΩ, preferably at least 50 TΩ.

10. The circuit according to claim 1, wherein the output stage comprises an integrator coupled to the output stage.

11. The circuit according to claim 10, wherein the integrator is arranged to serve as a voltage-to-frequency converter.

12. A mass spectrometer comprising a circuit according to claim 1.

13. The mass spectrometer according to claim 12, further comprising at least one of an ion source, a beam focus unit and a mass filter unit.

14. The mass spectrometer according to claim 13, wherein the mass filer unit comprises a multipole unit, preferably a quadrupole unit.

15. The mass spectrometer according to claim 13, wherein the mass filer unit comprises a magnetic sector unit.

* * * * *